United States Patent [19]

Schindler et al.

[11] Patent Number: 4,974,039
[45] Date of Patent: Nov. 27, 1990

[54] FIELD EFFECT TRANSISTOR HAVING AN INTEGRATED CAPACITOR

[75] Inventors: Manfred J. Schindler, Newton; Shiou L. L. Chu, Bedford, both of Mass.

[73] Assignee: Raytheon Company, Lexington, Mass.

[21] Appl. No.: 393,171

[22] Filed: Aug. 14, 1989

[51] Int. Cl.$^5$ .................. H01L 27/02; H01L 29/06; H01L 29/80; H03K 3/00
[52] U.S. Cl. ........................... 357/22; 357/51; 357/55; 307/277
[58] Field of Search ............ 357/225, 55, 51; 330/277

[56] References Cited

U.S. PATENT DOCUMENTS 4,456,888 6/1984 Ayasli .................................. 330/277
4,543,535 9/1985 Ayasli .
4,751,562 6/1988 Yamamura ........................ 357/51

OTHER PUBLICATIONS

M. J. Schindler et al., "Monolithic 6–18 GHz 3 Bit Phase Shifter", GaAs IC Symposium, (1985 IEEE), pp. 129–132.

Primary Examiner—Rolf Hille
Assistant Examiner—Wael Fahmy
Attorney, Agent, or Firm—Denis G. Maloney; Richard M. Sharkansky

[57] ABSTRACT

An integrated field effect transistor capacitor structure having a capacitor connected between source and drain electrodes is described. In one embodiment, the capacitor is formed over a drain contact by providing a dielectric over said contact and an airbridge upper plate between said dielectric to the adjacent source contact. Preferably, the capacitor dielectric is the same dielectric as the FET passivation.

11 Claims, 5 Drawing Sheets

FIELD EFFECT TRANSISTOR HAVING AN INTEGRATED CAPACITOR

The government has rights in this invention pursuant to Contract No. F33615-85-C-1729 awarded by the Dept. of the Air Force.

BACKGROUND OF THE INVENTION

This invention relates generally to monolithic microwave integrated circuits and more particularly to field effect transistors.

As is known in the art, monolithic microwave integrated circuits (MMIC) are used in radio frequency systems such as radars and the like. One type of MMIC circuit is an r.f. phase shifter using field effect transistors as the switching elements to switch a capacitance into or out of a circuit. Examples of such phase shifters are described in an Article entitled *Monolithic 6-18 GHz 3Bit Phase Shifter* by Schindler et al., 1985 IEEE GaAs IC Symposium Digest, pp. 129-132.

As is known, a field effect transistor includes a gate or control electrode, source and drain electrodes. In the above-mentioned reference, the field effect transistor is operated in a passive mode having the gate electrode fed by a D.C. bias which is used to control the conductivity between the drain and source electrodes. Capacitors or inductors are generally connected between the drain and source electrodes of the FET to provide switchable phase shift elements. The gate bias voltage is used to switch the drain and source channel region between an "on state" or low impedance state and "pinch-off" or high impedance state of the transistor. When the transistors are switched into the pinch-off state, the capacitors and inductors are switched into the circuit.

The actual impedance characteristic between source and drain electrodes in the "on" state of the transistor is a low impedance resistance (i.e. the channel resistance) in series with a parasitic inductance. Whereas the actual impedance characteristic in the pinch-off state of a transistor having a capacitor across source-drain electrodes is the capacitance of the switched capacitor in series with relatively high parasitic inductances. The conventional layout for a capacitor connected across source and drain electrodes requires the use of relatively long source and drain interconnect lines to the capacitor. These source and drain interconnects present the high parasitic inductance in series with the capacitance, as mentioned above. These high value inductances are undesirable when the transistor is employed as a switchable element in a phase shifter, since it leads to phase shift errors, and also reduces the bandwidth of the phase shifter.

It is also known that field effect transistors operate with gate and drain biases to provide amplification. One common amplification scheme is a distributed amplifier. As known, a distributed amplifier uses a plurality of field effect transistors having gate electrodes successively coupled by gate or input transmission line and drain electrodes successively coupled by a drain or output transmission line. It is generally desirable in distributed amplifiers to have equal impedance (Z) and phase velocities (VP) for the drain and gate lines. The impedance Z is given by $Z = L/C$, and the phase velocity is given by $VP = L \cdot C$ where L is the per unit distributed inductance and C is the inherent input or output capacitance of the transistors.

In general, the input capacitance $C_{GS}$ is much larger than the corresponding drain to source capacitance $C_{DS}$. One way to achieve equal phase velocity and equal impedance between gate and drain lines is to modify the inherent capacitance either by increasing the drain to source capacitance or reducing the gate to source capacitance. A scheme for reducing gate to source capacitance is shown in U.S. Pat. No. 4,543,535 assigned to the assignee of the present invention. This technique, however, is not desirable if high output power is not required, since it requires the use of a larger field effect transistor which makes the circuit larger. Therefore, it is often necessary to increase the drain to source capacitance. This is generally accomplished indirectly by using a series drain inductance which makes the effective drain to source capacitance appear large at the end of the drain line. The required series drain inductance can be quite large in order to provide an effectively large capacitance. A large inductance thus also provides for a large circuit. Therefore, it would be desirable to provide a capacitor across drain/source electrodes of the field effect transistor to provide an effectively larger capacitance. This capacitor would be physically smaller than the required inductance thus reducing the circuit size.

The problem with this approach, however, is that the effective capacitance required is quite small. With a small value capacitance, the parasitic inductance associated with adding the capacitor can dominant the overall reactance characteristic. This characteristic must be capacitive, however, for proper operations of such transistors as part of a distributed amplifier.

Figure 1:
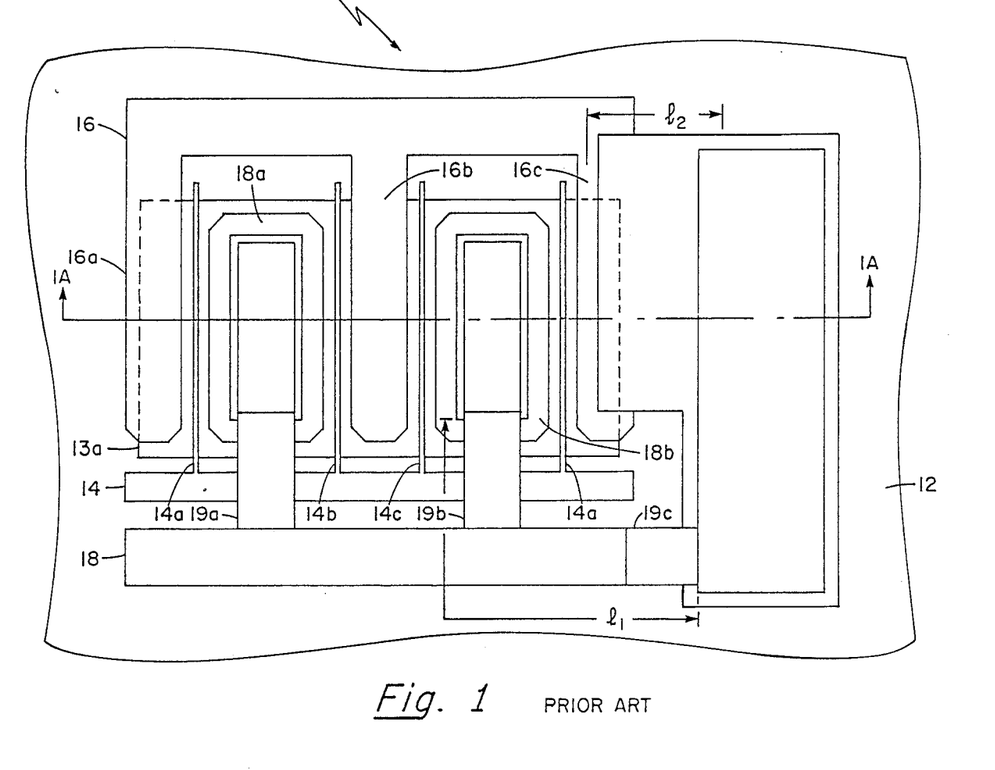
FIG. 1 is a plan view of a conventional field effect transistor having a capacitor disposed in shunt between source and drain electrodes.
Figure 1A:
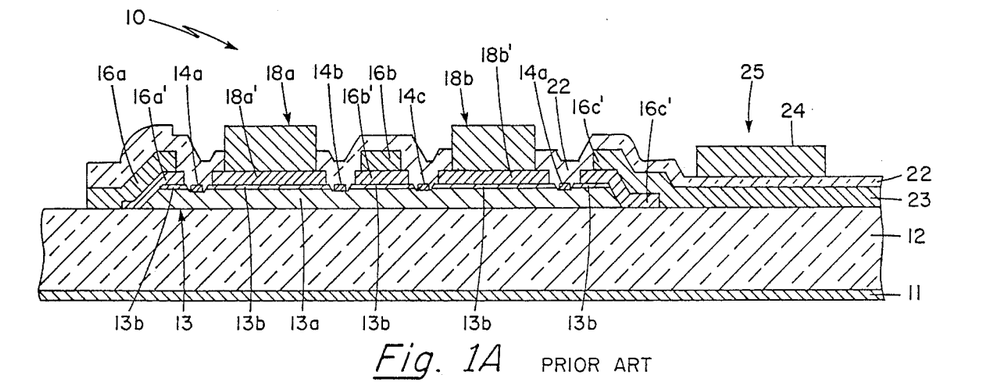
FIG. 1A is a cross section taken along line 1A—1A of FIG. 1.

A conventional transistor 10 having an external capacitor 25 is shown in FIGS. 1, 1A to include spaced parallel gate electrodes 14a-14d coupled to a common gate electrode pad 14 which is disposed off of a semiconductor active region 13. The semiconductor active region 13 is here an epitaxially grown active region and includes a moderately doped semiconductor layer 13a and a more highly doped, high conductivity contact layer portions 13b as is generally known. Drain electrodes 16a-16c and source electrodes 18a-18b have contact portions 16a'-16c' and 18a', 18b' disposed over regions 13b. The gate electrodes 14a-14d space the source and drain electrodes. The drain contacts 16a1 ∝ 16c are coupled to a common drain pad 16 disposed off of the mesa shaped semiconductor region 13a, and the source contacts 18a-18b are coupled to a common, off mesa source electrode 18 via airbridges 19a and 19b. A capacitor 25 is disposed off of the mesa active region 13a and includes a bottom metalization layer 23 disposed over substrate 12 and connected to the drain metalization 16c. The bottom metalization 23 provides one of the plates of the capacitor. Since a passivation layer 22 is commonly disposed over such transistors, the passivation layer 22 is extended over the bottom metalization layer 23 and forms a dielectric layer for the capacitor 25. A top metalization 24 is also disposed over the passivation layer 22 and provides an upper plate for the capacitor 25. The top layer of metalization 24 is connected to the common source electrode 18 by an airbridge 19c, as shown FIG. 1).

Several problems are provided by this particular arrangement. For example, the arrangement imposes a number of parasitic inductances into the transistor structure making modeling of the field effect transistor and the capacitor relatively difficult. These parasitics also degrade actual performance. The parasitics are principally the result of the relatively long electrical connections between source and drain electrodes and the capacitor. These lengths are represented by arrows $l_1$ and $l_2$ respectively. Moreover, since the capacitor is disposed off of the mesa portion of the FET, the presence of the capacitor increases the size of the transistor which is also generally undesirable since this also increases the magnitude of parasitic reactances referred to above. Moreover, the FET and shunt mounted capacitor also occupy more physical space which increases cost of the transistor and can also reduce circuit yields.

SUMMARY OF THE INVENTION

In accordance with the present invention, a field effect transistor having at least one integrated capacitor includes a substrate and an active region supported by said substrate, said active region having source, drain, and gate regions and at least one source contact disposed over said source region. At least one drain contact is also disposed over said drain region and a gate electrode is disposed on said gate region between said source and drain regions. A dielectric layer is disposed over a selected portion of said substrate. Preferable, the dielectric layer is part of a passivation layer disposed over said transistor and a portion of said passivation is disposed over at least a first one of said source and drain contacts. An airbridge conductor is disposed across the gate electrode. A first portion of the airbridge dielectrically coupled to the first one of said source and drain contacts by the portion of the dielectric layer and a second portion of said airbridge is coupled directly to a second one of said source and drain contacts. In one embodiment, the airbridge is connected to the second one of said contacts to provide a capacitor connected between source and drain electrodes, whereas in a further embodiment the airbridge is coupled through the dielectric to the second one of said contacts to provide a pair of capacitors connected in series between source and drain electrodes. With this particular arrangement, a capacitor is integrated over at least a first one of the source and drain contacts providing a more compact transistor having an integrated capacitor with relatively low parasitic inductance. That is, by using the airbridge to interconnect one of source and drains contact to a dielectric, the length of the interconnecting conductor is reduced providing a concomitant reduction in parasitic inductance reactance. Furthermore, if capacitors are distributed over each of the selected source or drain contacts, the capacitance will be balanced across the topography of the field effect transistor, thereby minimizing parasitics and improving device performance.

In accordance with a further aspect of the present invention, a field effect transistor includes an active layer having drain and source contact portions spaced by gate contact portions. A first plurality of drain electrodes are disposed in ohmic contact over drain contact portions and a second plurality of source electrodes are disposed in ohmic contact over source contact portions. A gate electrode is disposed in Schottky-barrier contact on said gate contact portions. A region of dielectric is disposed over at least a first one of each said first plurality of drain regions, and each second plurality of source regions. A conductive layer is disposed to couple to a second one of said first plurality of drain regions and second plurality of source regions through said region of dielectric. With this particular arrangement, individual capacitors are formed over at least a first one of source or drain contacts. This arrangement distributes the added capacitance across the device while minimizing the interconnection length and hence the parasitic inductance of said capacitors.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 2:
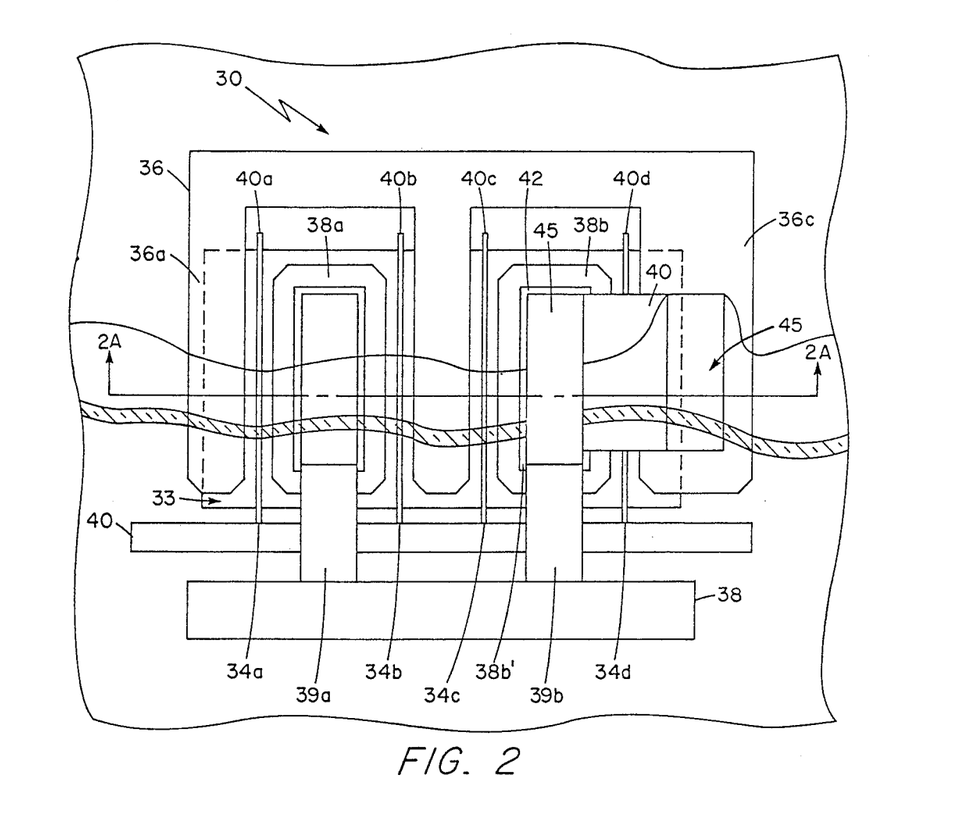
FIG. 2 is a plan view of a parallel gate transistor having an integrated capacitor disposed between source and drain electrodes in accordance with a first aspect of the present invention.
Figure 2A:
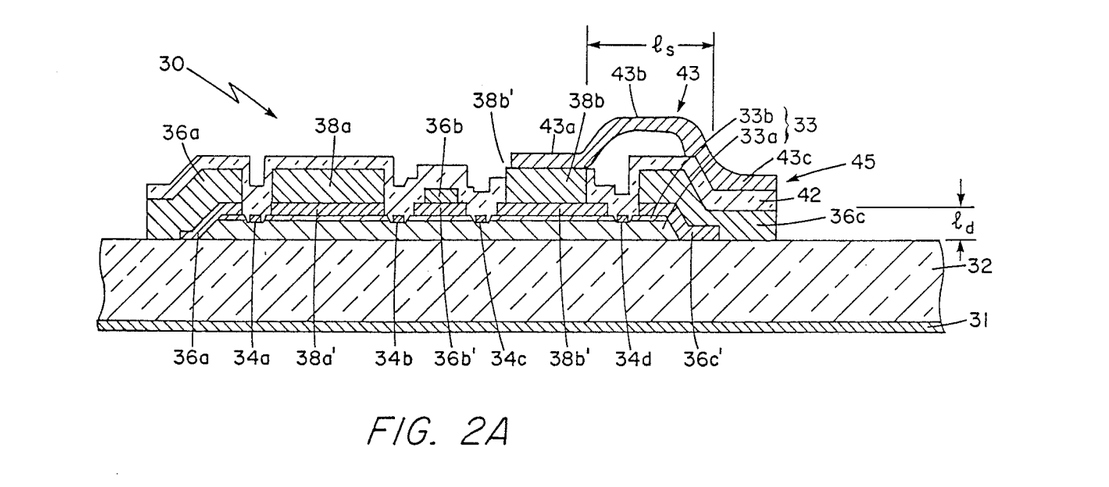
FIG. 2A—2A is a cross-sectional view taken along line 2A—2A of FIG. 2.

Referring now to FIGS. 2 and 2A, a parallel gate field effect transistor 30 here a metal electrode field effect transistor (MESFET) having an integrated capacitor 45 is shown to include an active region 33 disposed over a semi-insulating substrate 32, here comprised of gallium arsenide. The active region 33 is a mesa etched, epitaxially grown active region although an ion implanted active region could alternatively be used. The active region 33 here also of gallium arsenide in general would have highly doped drain and source regions 33b which form ohmic-type contacts with drain and source contacts, and a relatively lower doped regions 33a which provides Schottky-barrier contact with a gate electrode. Region 33a is doped N type with Si, for example, to a dopant concentration in the range of $1 \times 10^{16}$ to $1 \times 10^{18}$ atoms/cc, whereas regions 33b are doped to a concentration in excess of $1 \times 10^{18}$ atoms/cc.

Disposed over active region 33 are drain ohmic forming contact portions 36a'-36c' and drain electrodes 36a-36c coupled to a common drain pad 36, source ohmic contact portions 38a'-38b' and source electrodes 38a-38b coupled to a common source pad 38, via airbridges 39a, 39b, and parallel disposed gate Schottky-barrier electrodes 40a-40d coupled to a common gate pad 40. The source, drain, and gate contacts and electrodes, and the airbridges 39a, 39b are fabricated using conventional techniques. Disposed over the source, drain, and gate electrodes is a passivation layer 42 (shown partially torn away) here comprised of silicon nitride (Si3N4) or other suitable passivation material commonly used in the semiconductor art. Here, the passivation layer 42 is selectively patterned using conventional techniques to expose an underlying region of here the source electrode 38b. An upper metal layer 43 is disposed over the patterned source region 38b', the portion of the passivation layer 42 disposed over the gate 34d, and the portion of the passivation layer 42 disposed over drain contact 36c. The upper metalization 43 has an airbridge portion 43b which is used to span across the gate electrode 34d using conventional airbridge overlay techniques as is well known. Thus, disposed over drain contact 36c is a capacitor 45 comprised of drain metalization 36c, a portion 42a of passivation layer 42, and a portion 43c of the upper metalization 43. The airbridge conductor portion 43b connects portion 43c to portion 43a disposed on the source electrode 38b.

This particular layout for the capacitor 45 will provide lower parasitic inductances than the layout of FIG. 1 for capacitor 25 because of the shorter total interconnect lengths ld, ls between the drain and source electrodes and the capacitor plate portions formed by layer portions 43c and 36c. Alternatively, depending upon the particular layout for the transistor, the source and drain locations can be interchanged. Further, it is also common to have source and drain electrodes equal in size. This can be accommodated with the present arrangement.

Figure 3:
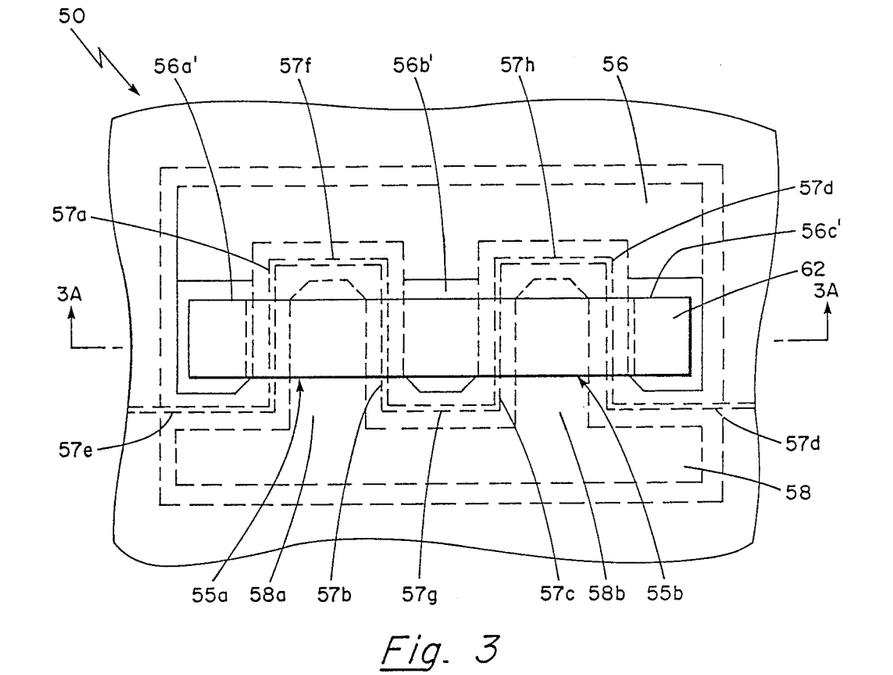
FIG. 3 is a plan view of a meandered gate field effect transistor having an integrated capacitor disposed over source electrodes of said transistors in accordance with a further aspect of the present invention.
Figure 3A:
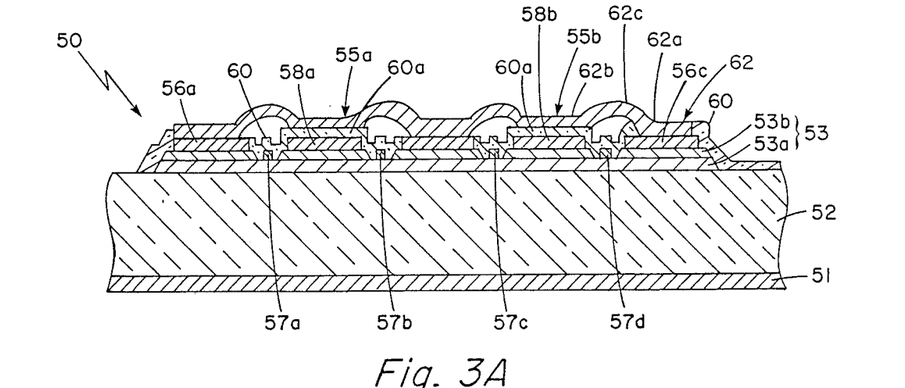
FIG. 3A is a cross-sectional view taken along line 3A—3A of FIG. 3.

Referring now to FIGS. 3 and 3A, a meandered gate electrode field effect transistor 50 having integrated, distributed capacitors 55a, 55b is shown. Such a transistor, without integrated capacitors 55a, 55b, is more generally described in U.S. Pat. Application Ser. No. 285,173 filed Dec. 17, 1988 and assigned to the assignee of the present invention, said application being incorporated herein by reference. Transistor 50 here includes a semi-insulating substrate 52 of gallium arsenide having disposed over a first surface thereof a mesa shaped, gallium arsenide active region 53 comprised of an N- type active layer 53a of gallium arsenide doped to a concentration generally in the range of $1 \times 10^{18}$ atoms/cc to $1 \times 10^{18}$ atoms/cc and generally a highly doped N+ type contact layer of gallium arsenide 53b generally doped in excess of $1 \times 10^{18}$ atoms/cc. The N+ type regions 53b provide source and drain regions whereas the N type regions 53a provide Schottky-barrier gate contact regions.

Disposed in ohmic contact with contact layer 53b are spaced source electrodes 56a-56c (FIG. 3A) connected to a source pad 56 and spaced drain electrodes 58a, 58b connected to a drain pad 58, as shown. A meandered gate electrode 57 having parallel portions 57a-57d coupled by serial portions 57e-57i is disposed on the active layer 53a. Here all portions 57a-57i of the gate 57 are disposed on the active layer 53a. Alternatively, the common drain pad 58, source pad 56 and the connecting, serial portions 57e-57i may be disposed off of the active layer 53 and on the substrate 52.

The integrated, distributed capacitors 55a-55b are provided by patterning a passivation layer 60 disposed over transistor 50 to expose underlying regions 56a'-56b' (FIG. 3) of here the source electrodes 56a-56c (FIG. 3A). An overlay metalization 62 comprised of gold provided using conventional airbridge overlay techniques has first portions 62a disposed on contacts 56a-56c, second portions 62b disposed on portions 60a of the passivation layer 60, and third metal airbridge portions 62c disposed over underlying gate electrodes 57a-57e, as shown. Thus, underlying metal layer portions 62b in regions thereof disposed over the drain electrodes 58a-58b, are portions of the passivation layer 60. Thus capacitors 55a-55b are formed over drain electrodes 58a, 58b by the combination of the metal layer portions 62b of overlay metalization 62 which provides a lower plate of each capacitor, underlying portions 60a of the passivation layer 60 which provide the dielectric for the capacitors, and the drain contacts 48a, 48b which provide the upper plate of each capacitor 55a, 55b respectively. Such capacitors 55a, 55b are distributed across the transistor and connected between drain and source electrodes with minimal conductor length and hence minimal parasitic inductive reactance.

Alternatively, capacitors may be formed over both source and drain electrodes. An airbridge may be used to connect upper plates of each of said capacitors together to form a pair of capacitors connected in series between source and drain electrodes.

Figure 4:
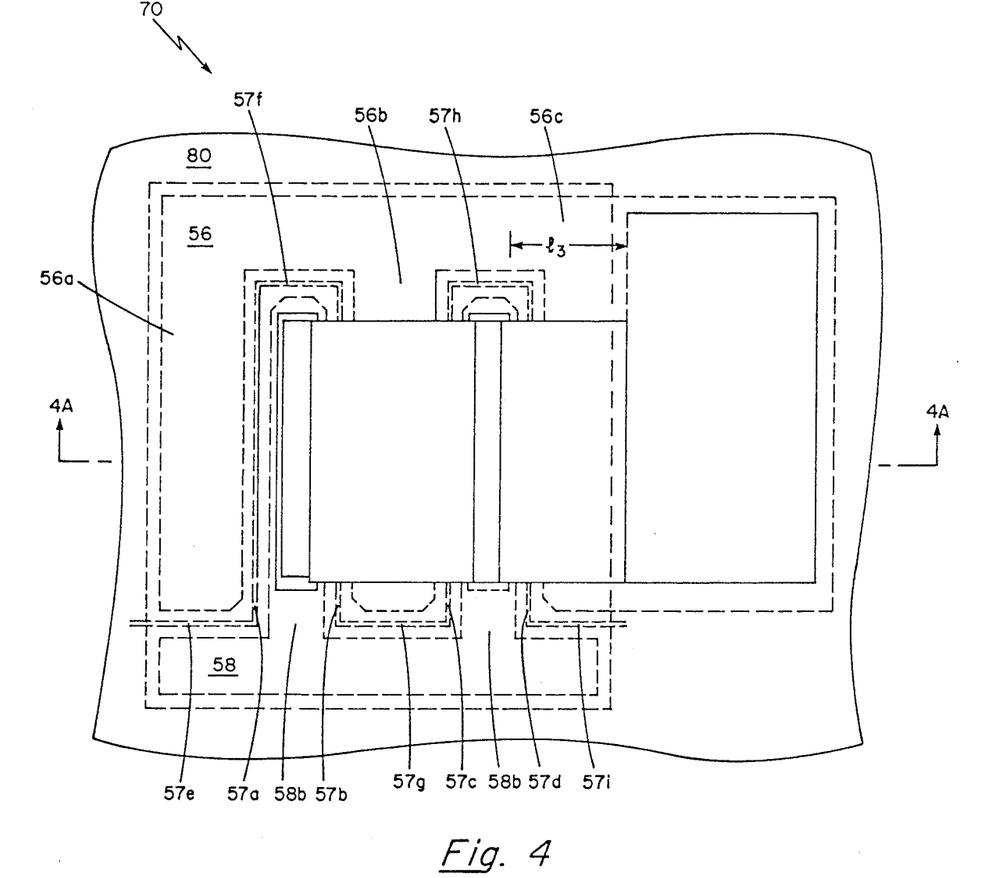
FIG. 4 is a plan view of a further embodiment of a transistor having an integrated capacitor.
Figure 4A:
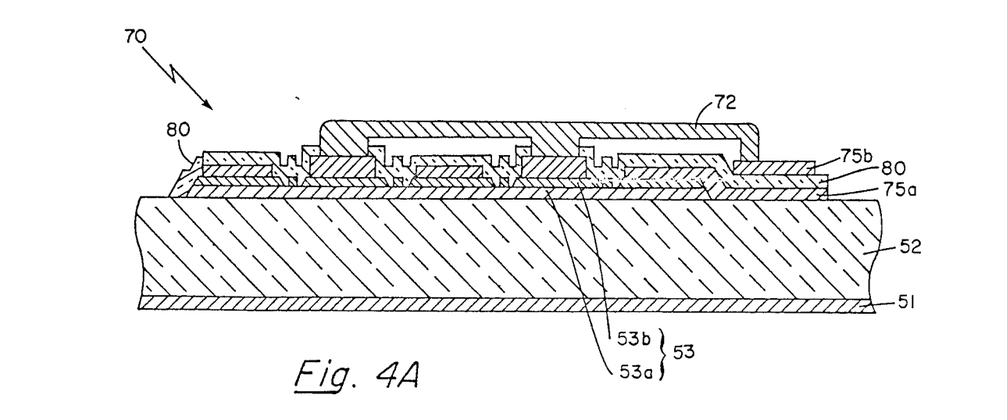
FIG. 4A is a cross-sectional view taken along line 4A—4A of FIG. 4.

Referring now to FIGS. 4 and 4A, an alternate embodiment for a capacitor 75 coupled to a meandered gate electrode field effect transistor 70 is shown. Transistor 70 here includes the semi-insulating substrate 52 of gallium arsenide having disposed over a first surface thereof, a mesa-shaped active region 53 including an N type active layer 53a of gallium arsenide doped to a concentration generally in the range of $1 \times 10^{16}$ atoms/cc to $1 \times 10^{18}$ atoms/cc and generally a highly doped N+ type contact layer 53b of gallium arsenide generally doped in excess of $1 \times 10^{18}$ atoms/cc, as generally described in conjunction with FIGS. 3 and 3A. As described above, the N+ type region 53b provides source and drain contact regions, whereas the N type region 53a provides Schottky-barrier contact regions. Disposed over portions of contact layer 53b are spaced source electrodes 56a-56c and spaced drain electrodes 58a, 58b, as shown. Here said electrodes are disposed in ohmic contact with the contact layers 53b. A meandered gate electrode 57 having parallel portions 57a-57d coupled by serial portions 57e-57i, as also described in conjunction with FIG. 3 is here disposed on the active layer 53a.

In this arrangement, the integrated capacitor 75 is disposed off of the active layer 53 and on substrate 52. The capacitor 75 is provided by forming an extended portion 75a of here drain electrode 56c which provides an underlying or first plate 75a of the capacitor 75. The dielectric for the capacitor 75 is here provided by a portion 79a of a passivation layer 79 as generally described above in conjunction with FIG. 3 for the passivation layer 60. A second layer of metalization 75b is disposed over portion 79a of passivation layer 79 using conventional techniques and said metalization layer 75b is interconnected directly to here each of source electrode contacts 58a, 58b by an overlay airbridge metalization 72, as shown. The airbridge metalization is provided using conventional airbridge plating or evaporation techniques. With this particular arrangement, an integrated metal electrode field effect transistor (MESFET) is provided to interconnect directly to the source electrodes of the transistor. The length ($l_3$) between this connection is shorter than the prior art connection to the source electrode pad as shown in FIG. 1. Hence, lower parasitic inductive reactance will be provided with this interconnect.

Figure 5:
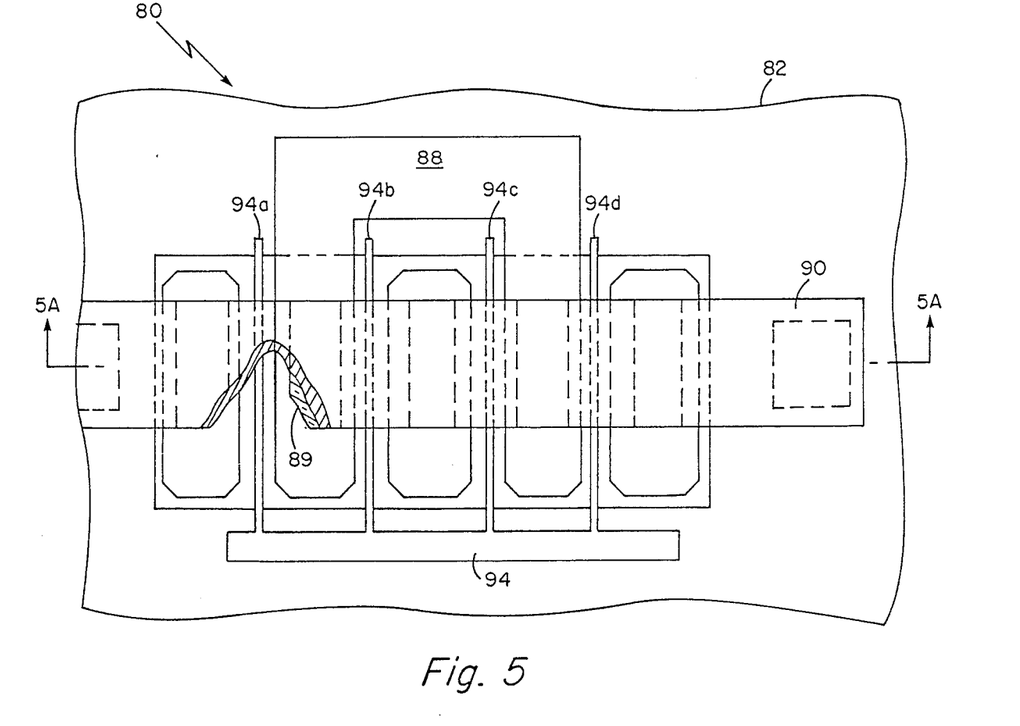
FIG. 5 is a plan view of a further embodiment of a transistor having integrated capacitor particular adapted for distributed amplifier applications.
Figure 5A:
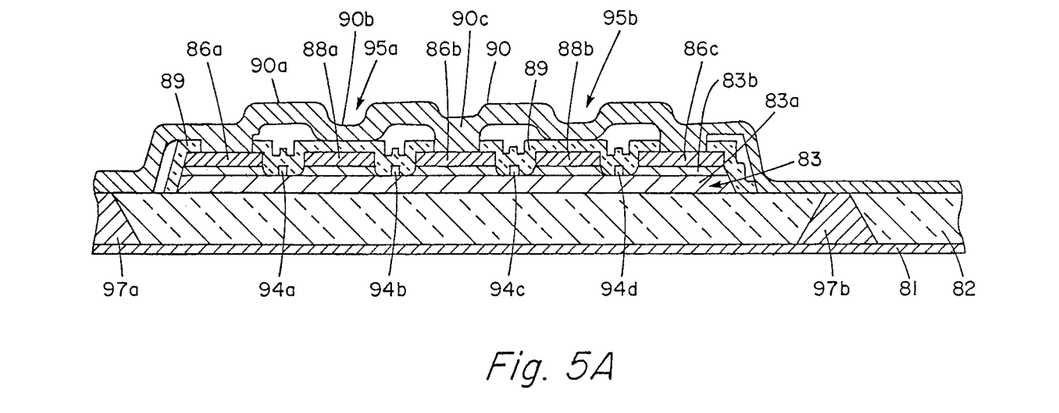
FIG. 5A is a cross-sectional view taken along line 5A—5A of FIG. 5.

Referring now to FIG. 5, a field effect transistor 80 particularly adapted for amplification applications includes a plurality of here two capacitors 95a, 95b as shown. Transistor 80 here includes a semi-insulating substrate 82 of gallium arsenide having disposed over a first surface thereof a mesa-etched active region 83, said active region including a active layer 83a having a dopant concentration typically in the range of $1 \times 10^{16}$ atoms/cc to $1 \times 10^{18}$ atoms/cc and a highly doped N+ contact layer 83b also of gallium arsenide having a dopant concentration in excess of about $1 \times 10^{18}$ atoms/cc as is generally known. Disposed over portions of the N+ type region 83b are source and drain contacts 86a-86c and 88a-88b, respectively. Source contacts 86a-86c are coupled by an overlay metalization 90 to one of here a pair of pads having via holes 97a, 97b which couples said overlay metalization to a ground plane conductor 81, as is also commonly known. The drain electrodes 88a-88b are coupled to a common drain pad 88. Parallel gate electrodes 94a-94d are disposed in Schottky-barrier contact with the active layer 83a. The gate electrodes 94a-94d are disposed between respective pairs of source and drain electrodes as also shown. Disposed over said transistor 80 and underlying said overlay metalization 90 is a passivation layer 89 (partially shown in FIG. 5) as generally described above in conjunction with FIG. 3A for passivation layer 60. Here said passivation layer 89 also comprised of silicon nitride or other suitable passivation dielectric material is patterned to provide openings over source electrodes 86a-86c prior to placement of the overlay metalization 90, as described previously to provide direct electrical contact between the overlay metalization and the source electrodes. Thus, the passivation layer 89 is disposed over the drain electrodes 88a and 88b prior to placement of the overlay metalization 89. Thus, the portions 90b of the overlay metalization 90 disposed over the drain electrodes 88a, 88b provide one of the plates of the capacitors 95a, 95b. Portions 90a of said overlay metalization provide airbridges over the underlying gate electrodes 94a-94d and remaining portions 90c of said overlay metalization 90 provide a direct electrical contact between the capacitor and the source electrodes 86a-86c.

This arrangement reduces the length of the interconnections between the plates of the capacitors and the source and drain electrodes to provide a field effect transistor with a capacitor having relatively low parasitic inductive reactance. Thus, this particular configuration of the transistor is suitable for use in distributed amplifier applications, for example, since the value of capacitance of each of the capacitors can be selected to be relatively low while also providing a concomitant reduction in the inductive parasitic reactance associated with the interconnections of the capacitor to the source and drain electrodes. This capacitor can be, therefore, used to increase the drain to source capacitance in transistors employed in distributed amplifiers to permit the drain and gate lines to have equal impedance and phase velocities as described earlier.

Alternatively, capacitors may be formed over adjacent source and drain electrodes and interconnected by the airbridge to provide a pair of series connected capacitors.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A field effect transistor comprising:
   a substrate;
   an active region supported by said substrate, said active region having a plurality of source contacts disposed over said active region, coupled to a common source pad; a plurality of drain contacts disposed over said active region, coupled to a common drain pad, and a gate electrode disposed between respective source and drain contacts in Schottky-barrier contact with said active region;
   a dielectric layer; and
   a conductor having a first portion coupled to a first one of at least one of said source and drain contacts, and having a second portion coupled to a second one of at least one of said source and drain contacts through a portion of said dielectric layer, with said second one of said source and drain contacts, said portion of said dielectric layer, and said conductor providing in combination at least one capacitor.

2. The transistor of Claim 1 wherein the portion of said dielectric is disposed on said second one of source and drain contacts.

3. The transistor of claim 2 wherein said dielectric layer is a portion of a passivation layer disposed over said active layer and the second one of said source and drain contacts.

4. The transistor of claim 2 wherein said passivation is $Si_3N_4$.

5. The transistor of claim 1 wherein said conductor is further connected to a ground plane conductor disposed over a surface of said substrate opposite to the surface supporting the active region.

6. A field effect transistor comprises:
   an active layer having drain and source contact portions and gate contact portions spacing said drain and source contact portions;
   a first plurality of drain electrodes disposed in ohmic contact over drain contact portions;
   a second plurlaity of source electrode portions disposed in ohmic contact over source contact portions;
   a third plurality of gate electrodes disposed in Schottky-barrier contact on said gate contact portions;
   a plurality of regions of dielectric disposed over at least a first one of said first plurlaity of drain electrode portions and second plurality of source electrode portions; and
   a conductive layer disposed to interconnect at least a second one of said first plurality of drain electrode portions and second plurality of source electrode portions with at least the first one of said first plurality of drain electrode portions and second plurality of source electrode portions through said plurality of regions of dielectric.

7. A transistor of claim 6 wherein said plurality of regions of dielectric are portions of a passivation layer disposed over said active layer.

8. A transistor of claim 7 wherein said passivation layer is $Si_3N_4$.

9. A field effect transistor comprises:
   an active layer having drain and source contact portions and a gate contact portions, said layer being comprised of doped gallium arsenide;

a first plurality of drain electrode portions disposed in ohmic contact over drain contact portions of said active layer;

a second plurality of source electrode portions disposed in ohmic contact over source contact portions of said active layer, said source electrode portions being spaced from said drain electrode portions by gate contact portions of said active layer;

a meandered gate electrode having a first plurality of portions disposed in Schottky-barrier contact on said gate contact portions of said active layer and second electrode portions disposed to serially interconnect the first electrode portions;

a plurality of regions of dielectric disposed over a first one of said first plurality of drain electrode portions and second plurality of source electrode portions; and a conductive layer disposed to interconnect a second one of said first plurality of drain electrode portions and second plurality of source electrode portions with the first one of said first plurality of drain electrode portions and second plurality of source electrode portions through said regions of dielectric.

10. The transistor of claim 9 wherein said portions of the dielectric layer are portions of a passivation layer disposed over said active layer and the first one of said first plurality of drain electrode portions and second plurality of source electrode portions.

11. The transistor of claim 10 wherein said passivation layer is $Si_3N_4$.

* * * * *